United States Patent
Wight

(10) Patent No.: US 6,603,352 B2
(45) Date of Patent: Aug. 5, 2003

(54) SWITCHED-MODE POWER AMPLIFIER INTEGRALLY PERFORMING POWER COMBINING

(75) Inventor: James Stuart Wight, Ottawa (CA)

(73) Assignee: IceFyre Semiconductor Corporation, Ottawa (CA)

(*) Notice: Subject to any disclaimer, the term of this patent is extended or adjusted under 35 U.S.C. 154(b) by 0 days.

(21) Appl. No.: 10/004,703

(22) Filed: Dec. 3, 2001

(65) Prior Publication Data

US 2003/0102915 A1 Jun. 5, 2003

(51) Int. Cl.$^7$ ............................................... H03F 3/217
(52) U.S. Cl. ...................... 330/251; 330/10; 330/188; 330/207 A; 330/271
(58) Field of Search ............................ 330/207 A, 251, 330/10, 271, 188

(56) References Cited

U.S. PATENT DOCUMENTS

| | | | |
|---|---|---|---|
| 3,854,100 A | * 12/1974 | Pouzadoux | 330/251 |
| 3,931,582 A | * 1/1976 | Kato et al. | 330/10 |
| 3,934,099 A | * 1/1976 | Elder, Jr. | 379/405 |
| 4,764,735 A | * 8/1988 | Jones | 330/271 |
| 4,968,949 A | * 11/1990 | Torrano et al. | 330/188 |
| 6,331,801 B1 | * 12/2001 | Schmitt et al. | 330/10 |

* cited by examiner

Primary Examiner—Michael Tokar
Assistant Examiner—Linh Van Nguyen
(74) Attorney, Agent, or Firm—Cantor Colburn LLP

(57) ABSTRACT

A switched-mode power amplifier is configured for performing power amplification of a plurality of signals input thereto and integrally summing (combining) those signals. Conceptually, this is achieved by replacing the center-tapped input winding component of the transformer within a conventional, balanced-type transformer-coupled voltage switching amplifier with separate input components, one for each input signal, in similar manner to the configuration of the input components of a conventional three-port combiner (trifilar). Accordingly, the input winding of the amplifier's transformer is comprised of a plurality of series-coupled windings, one for each of the plurality of input components/signals. In one embodiment, using balanced amplifier input components comprising series-coupled center-tapped windings, the center tap of each input winding is connected to a voltage rail and each terminal end of the winding is driven by an amplifying active device (i.e. transistor) fed by the input signals for that input component. These active devices alternately switch between a low output impedance and a high output impedance whereby the resulting parallel output impedance is low. Consequently, the series-coupled center-tapped windings of the plurality of input components constitutes a series connection of low output impedance sources applied to the amplifier's resonator and load. This, in turn, provides a high level of isolation between the amplifier input components and results in a low level of loss.

16 Claims, 4 Drawing Sheets

SWITCHED-MODE POWER AMPLIFIER INTEGRALLY PERFORMING POWER COMBINING

FIELD OF THE INVENTION

The invention relates to circuitry for radio frequency (RF) transmitters and in particular to amplifier circuitry providing signal combining integral to the power amplification.

BACKGROUND OF THE INVENTION

Typically, power combiners are used in RF transmitters to combine the output signals of parallel power amplifiers into one high power RF output signal for wireless transmission. In these known transmitter structures the signals are first amplified by the power amplifiers and then they are combined by a power combiner to produce a combined amplified signal for transmission. Depending upon the circuit architecture and signal format used, however, it becomes necessary to make trade-offs between reducing power losses and achieving isolation between input signals of the combiner.

The need for efficiency is a particularly important design factor for the highly integrated requirements of transceivers used for wireless local area networks (LANs) and employing modulation formats such as OFDM (Orthogonal Frequency Division Multiplex). Moreover, the inventor has developed signal modulation methods, using OFDM signal format, whereby information signals are deconstructed into independent component signals, which are then more efficiently processed and modulated than the original information signals, for up-conversion, amplification and combination prior to transmission. These independent modulated signals present additional challenges to achieving efficiency at the amplification/combination stages of the transmitter when using the conventional model of amplification followed by combining due to inherent loss and isolation limitations of the known power amplifiers and combiners.

Non-reciprocal combiners are non-economic for applications such as low cost wireless and, instead, reciprocal combiners, realized as either four-port or three-port structures, are available for use in such applications. Four-port combiners provide an advantage of isolation between the individual inputs (which means that the output impedances of the amplifier stages do not load each other) but where the signals being amplified are non-identical (i.e. statistically independent) an inherent loss of 3 dB results (this loss disappears where the signals are identical due to resonance). Thus, four-port combiners are generally only suitable for use where the signals being amplified are identical.

A three-port combiner, also known as a trifilar, is able to provide a degree of isolation between its individual inputs, depending on the output impedance of the amplifiers feeding it as well as the load impedance connected to the combiner's output. If the output impedances of the individual amplifiers and the output loading impedance of the combiner are the same, then no isolation is provided, resulting in an inherent loss of 3 dB. On the other hand, if the output impedances of the amplifiers are small in comparison with the output loading impedance of the combiner, then the inherent loss diminishes, and approaches 0 dB for 0 ohms output impedance.

The many classes of power amplifiers can be broadly sorted into two classifications; linear and switched-mode. Linear amplifiers provide an output-impedance resulting from the bias condition and load line for the active device (in the usual case the active device being a transistor). In practice, this output impedance is typically in the range of 5 to 50 ohms. As a result, only limited isolation is achievable when using a three-port combiner (trifilars) to combine the outputs of two linear amplifiers. A conventional switched-mode power amplifier (class D or class E) consists of an input component of active (switching) devices, a central transformer component and an output component consisting of a resonator. It is impractical to apply the output signals of separate switched-mode amplifiers to a trifilar to combine them because of the cost and space requirements (and resulting inefficiency) associated with the multiple transformer windings required for such a design.

There exists a need for new and efficient means to achieve power amplification and combining of modulated signals in transmitters.

SUMMARY OF THE INVENTION

A switched-mode power amplifier is configured for performing power amplification of a plurality of signals input thereto (i.e. analog phase modulated signals), and integrally summing (combining) those signals. Conceptually, this is achieved by replacing the center-tapped input winding component of the transformer within a conventional balanced-type transformer-coupled voltage switching amplifier with separate input winding components, one for each input signal, in similar manner to the configuration of the input components of a conventional three-port combiner (trifilar). Accordingly, the input winding of the amplifier's transformer is comprised of a plurality of series-coupled windings, one for each of the plurality of input components/signals.

In accordance with the invention there is provided a switched-mode power amplifier configured for integrally amplifying and summing a plurality of signals input thereto. The amplifier comprises an input component for each of the plurality of input signals, an output resonator component and a transformer component there between. The transformer component comprises a plurality of series-coupled input windings and an output winding. Each input component comprises an input winding and a plurality of active devices wherein the active devices are configured to be alternately switched by the input signal for that input component so as to present an amplified signal corresponding to the input signal at the input winding. Each input component provides a low output impedance. As a result of the series-coupled amplified signals on the input windings of the transformer, the output winding presents a summation signal corresponding to a summation of those amplified signals.

In one preferred embodiment the input component of the amplifier of the invention comprises two active devices and the input winding is a center-tapped winding the center tap of which is connected to a voltage rail, each terminal end of the winding being fed by one of the active devices.

Advantageously, the active devices alternately switch between a low output impedance and a high output impedance whereby the resulting parallel output impedance is low. Consequently, the series-coupled center-tapped windings of the plurality of input components constitutes a series connection of low output impedance sources applied to the amplifier's resonator and load. This, in turn, provides a high level of isolation between the amplifier input components and results in a low level of loss.

In another preferred embodiment the input component of the amplifier of the invention comprises two coupled pairs of active devices arranged in bridge configuration with the input winding, wherein each pair is alternately switched, one active device of each pair being connected to a voltage rail and the other active device of each pair being connected to ground, the input winding coupling together each pair of active devices.

Also in accordance with the invention there is provided a method for amplifying and summing a plurality of input signals to produce a single amplified, summation signal for input to a resonator component. Each input signal is amplified by a separate amplifier input component having a low output impedance to produce an amplified signal corresponding to the input signal within a winding of the input component. To perform the amplifying the input signal is applied to active devices of the input component to cause alternate switching of the active devices. The windings of the input components are coupled in series to provide an effective input winding for a transformer component. The summation signal is thereby presented within an output winding of the transformer configured for output to the resonator component.

BRIEF DESCRIPTION OF THE DRAWINGS

Exemplary preferred embodiments of the invention are described in detail below with reference to the following drawings in which like references refer to like elements throughout.

DETAILED DESCRIPTION OF A PREFERRED EMBODIMENTS

Surprisingly, the inventor has invented and developed a means for achieving improved power amplification and power combining which provides greater efficiency over the known, successively staged power amplifier and combiner designs. Advantageously, the switched-mode amplifier of the present invention integrally performs power amplification and combining of signals input thereto. According to the invention multiple input signals are combined (summed) inside the power amplifier after they are amplified and before they are applied to the resonator component of the amplifier, and hence to a load impedance. This contrasts markedly with the known power amplifiers for which power combining takes place following the complete amplification process. A known (prior art) switched-mode power amplifier is illustrated by FIG. 1 and a known (prior art) three-port power combiner (trifilar) is illustrated by FIG. 2, the manner of operation of both of these devices being well understood by persons skilled in the art.

Figure 1:
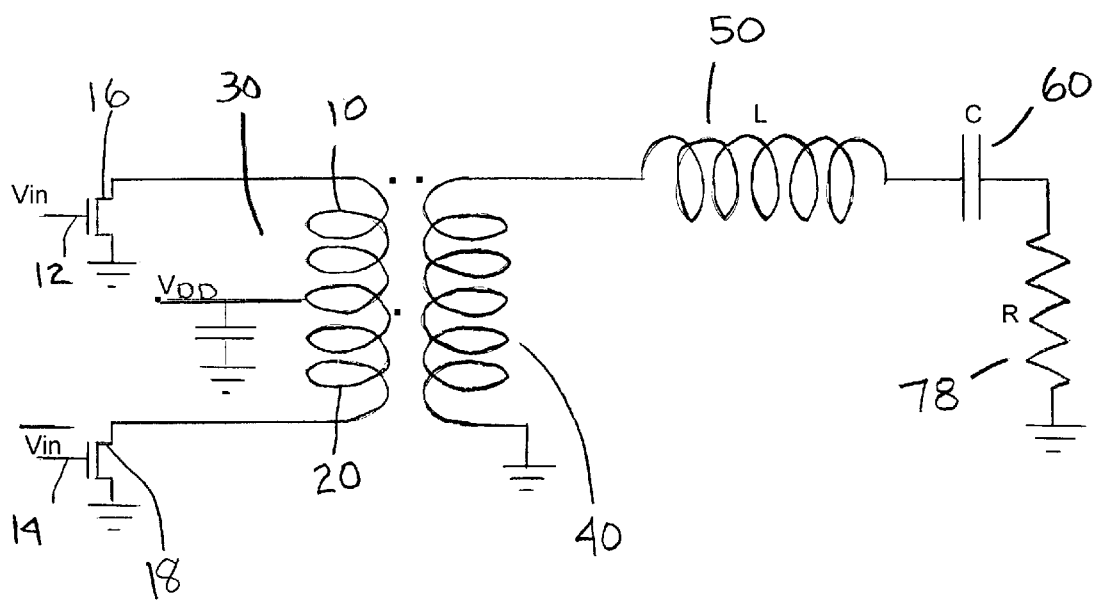
FIG. 1 illustrates a prior art balanced switched-mode power amplifier (class D or class E) having a voltage switching architecture.
Figure 2:
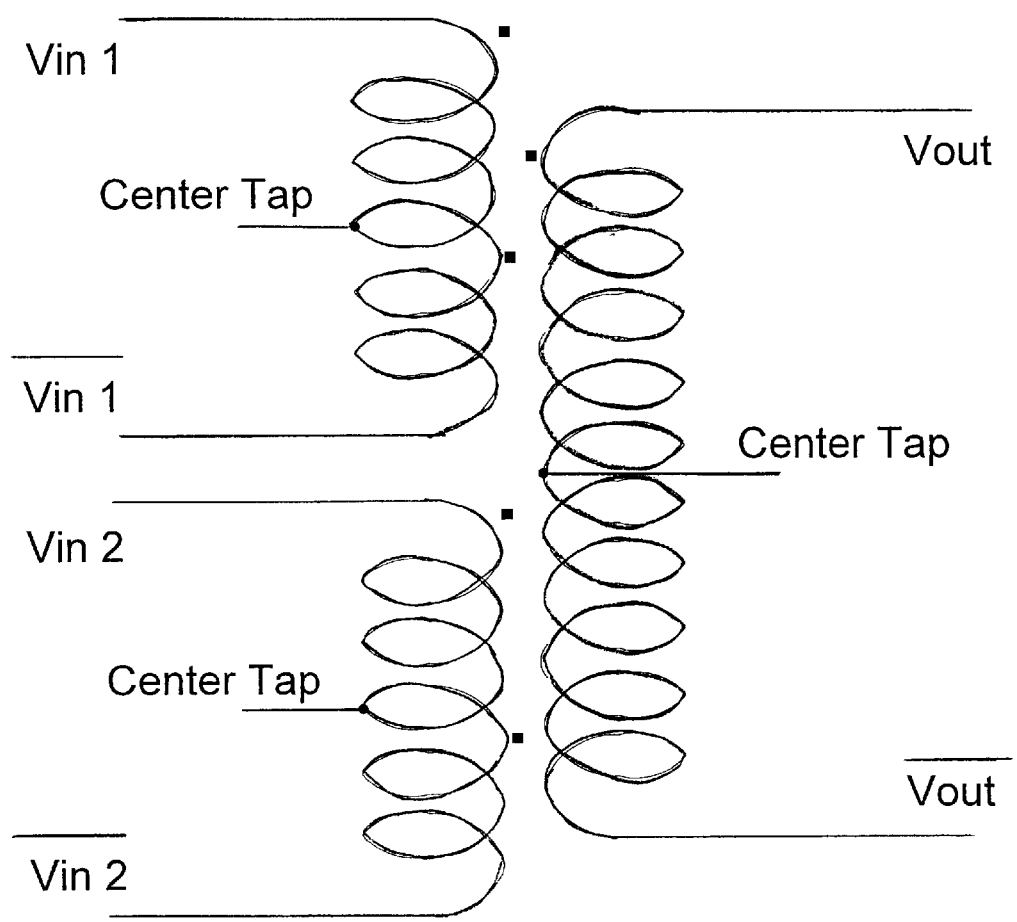
FIG. 2 illustrates a prior art three-port power combiner (trifilar)

The prior art switched-mode power amplifier shown by FIG. 1 has a transformer-coupled voltage switching architecture and comprises a balanced center-tapped input winding 30 made up of input winding components 10, 20 and an output winding 40 which, together, make up a transformer component of the amplifier. The manner of operation of this amplifier is well known by persons skilled in the art. In operation, the outputs of the active devices (transistors) 16, 18 function as a teeter-totter switch, switching between the two input levels of the signals Vin and $\overline{Vin}$ 12, 14, where $\overline{Vin}$ is the inverse of Vin (Vin being a constant envelope phase modulated signal). The resulting signals produced by each input winding component 10 and 20 track the phase changes of the input signal Vin and alternately switch between a voltage rail $V_{DD}$ and ground. Therefore, the signals at winding components 10 and 20 are two complementary square wave voltage signals which are combined by the input winding 30 to produce an amplified signal corresponding to the input signal Vin. The half windings are balanced and have a high coupling coefficient between them, for purposes of efficiency. The amplified summation signal which results across the output winding 40 of the transformer component is connected in series to a tuned output resonator (filter) component, comprising an inductor (L) 50 and capacitor (C) 60, for output to a load impedance (R) 78.

The active devices 16 and 18 of the foregoing switched-mode amplifier never experience, simultaneously, a voltage across them and a current through them. Consequently, they present an output impedance that alternates between an open circuit and a short circuit. The output impedance for each individual active device is complementary to that of the other active device in that when one is an open circuit, the other is a short circuit. When an open circuit is presented to one component, 10 or 20, of the input winding 30 it does not load the transformer (since no current will flow through that particular input winding component 10 or 20) and the resulting composite impedance presented to the transformer is that of the short circuit (zero ohms) from the complementary input winding component 20 or 10, respectively. Note that this exemplary switched-mode amplifier uses voltage switching. An alternative to voltage switching is to use current switching which switches between a current source and an open circuit. However, in practice such alternative may be less desirable due to the need to provide a constant current source.

The inventor has discovered that this very low (theoretically zero) output impedance presented by the active devices 16, 18 of a switched-mode amplifier can be used advantageously to achieve a superposition i.e. combining of signal voltages. Specifically, the inventor has made a surprising discovery that such a superposition of voltage signals is achieved by replacing the center-tapped transformer of the foregoing balanced switched-mode power amplifier architecture (e.g. class D or E) with separate input stages in similar manner to a three-port combiner (trifilar).

Figure 3:
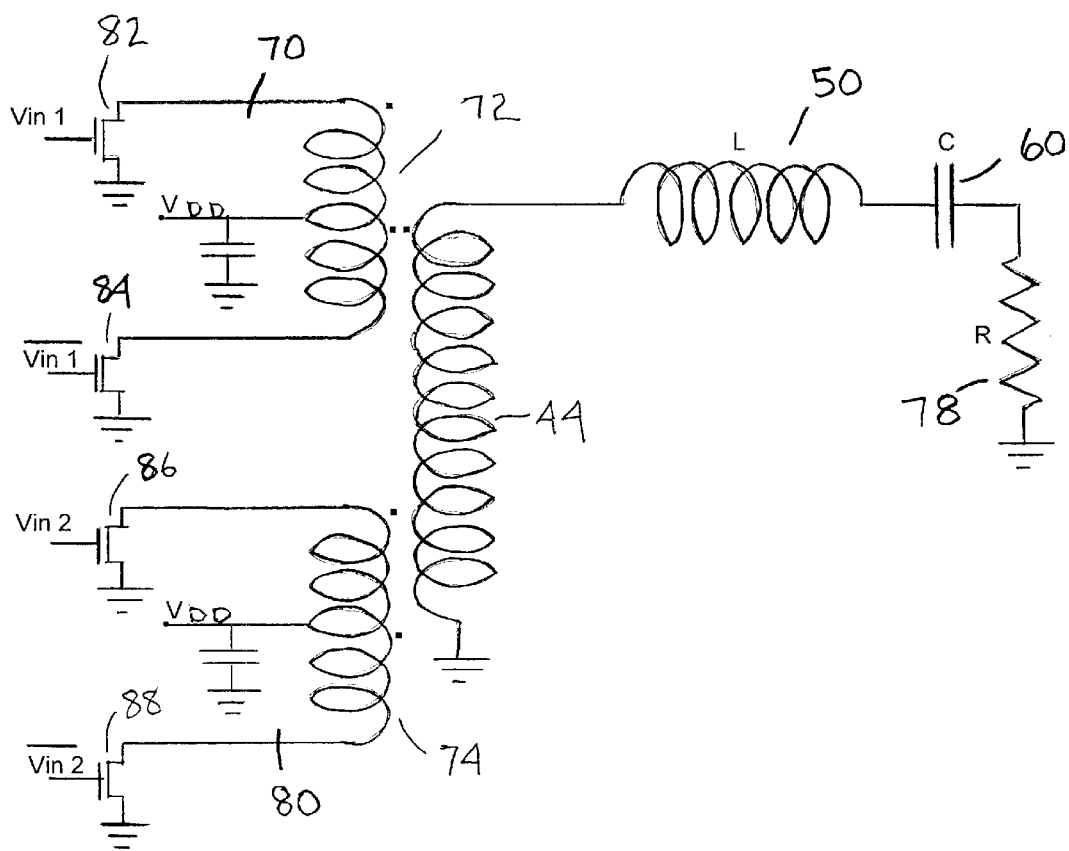
FIG. 3 illustrates a switched-mode power amplifier (class D or class E) configured for performing power amplification of a plurality of signals input thereto and integrally summing (combining) those signals, wherein one half of the center-tapped winding of each input component of the amplifier is used for each half cycle of the signal input thereto (Vin1 and Vin2); and, FIG. 4 illustrates a switched-mode power amplifier (class D or class E) configured for performing power amplification of a plurality of signals input thereto and integrally summing (combining) those signals, wherein the full winding of each input component of the amplifier is used for each half cycle of the signal input thereto (Vin1 and Vin2) rather than the center-tapped (i.e. half windings of the embodiment of FIG. 3.

An illustration of a first embodiment of the invention is provided by FIG. 3 from which it can be seen that the input winding 30 (consisting of winding halves 10 and 20) of the transformer of the prior art amplifier illustrated by FIG. 1 has been replaced, in the switched-mode amplifier of the invention, by input windings 72 and 74 of separate input components 70 and 80, one for each of two input voltage signals Vin1 and Vin2 which are to be amplified and combined, wherein each input component 70, 80 comprises active devices 82 and 84, 86 and 88, resp., and the input windings 72, 74, resp. As such, each input component 70, 80 functions in similar manner to one trifilar input.

As shown by FIG. 3, the signals Vin1, $\overline{\text{Vin1}}$ and Vin2, $\overline{\text{Vin2}}$ are fed to the active devices 82, 84 and 86, 88, respectively (whereby $\overline{\text{Vin1}}$ is the inverse of Vin1 and $\overline{\text{Vin2}}$ is the inverse of Vin2). Windings 72 and 74 see only the very low impedance (theoretically zero) of the active device which drives them (i.e. the active device which is switched on and presents a short circuit). The two input component windings 72 and 74 are coupled in series and, by superposition, the current waveforms generated within these windings by the two input voltage signals Vin1 and Vin2 are caused to superimpose and result in a summation of the two signals within the output winding 44 which is connected at one terminal end to ground and at the other terminal end to a resonator component 50, 60. This summation occurs within the amplifier before the amplified, summed signal is fed to the resonator component 50, 60 and hence to a load impedance 78. As such, a single amplifier resonator is shared between the two switched-mode amplifier input signals Vin1 and Vin2. In an optional, alternative embodiment both terminal ends of the output winding 44 may be connected to a resonator component in a balanced manner (instead of one terminal end being connected to ground as illustrated in FIG. 3).

Advantageously, the amplifier of the invention achieves such combining of non-identical (independent) input signals Vin1 and Vin2 with low (theoretically zero) loss. Although the illustrated embodiment herein uses only two input signals (Vin1 and Vin2, being analog, constant envelope phase modulated signals) a larger number of input signals (i.e. Vin1, Vin2, Vin3, . . . ) may be amplified in similar manner in accordance with the invention.

Figure 4:
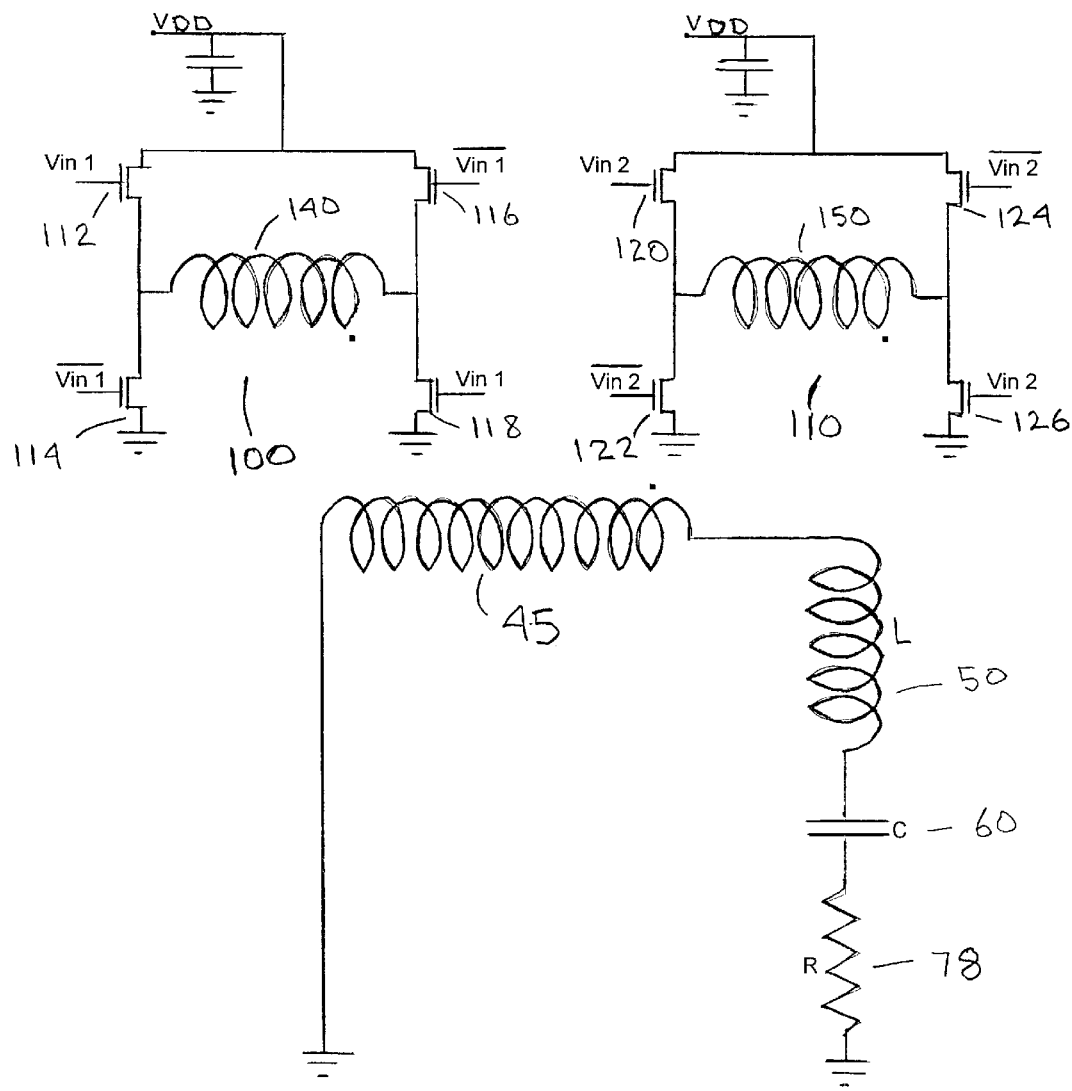

FIG. 4 illustrates an alternate embodiment of the invention comprising a bridge architecture for the amplifier input components 100 and 110 rather than the balanced architecture of the embodiment of FIG. 3 (and prior art amplifier illustrated by FIG. 1). In this embodiment the full input component winding 140, 150 of each input component 100 and 110 is used for each switched cycle of the signal input thereto (Vin1 and Vin2). This differs from the balanced architecture of the embodiment of FIG. 3 in which half windings, only, are energized at any given time and, thus, the half windings must be highly coupled. As shown, for each input component 100 and 110 bridge-configured (i.e. cross-located) pairs of active devices (transistors) 112 and 118, 114 and 116 and 120 and 126, 122 and 124, respectively, are alternately switched between an open circuit and a short circuit. As a result, the direction of current flow through each of the windings 140, 150 is alternately switched every half cycle of the signal and the full winding is used each time. Therefore, this embodiment avoids the need to ensure highly coupled half windings associated with the embodiment of FIG. 3.

The individual electronic and processing functions utilised in the foregoing described embodiment are, individually, well understood by those skilled in the art. It is to be understood by the reader that a variety of other implementations may be devised by skilled persons for substitution. Persons skilled in the field of electronic and communication design will be readily able to apply the present invention to an appropriate implementation for a given application.

Consequently, it is to be understood that the particular embodiments shown and described herein by way of illustration are not intended to limit the scope of the invention claimed by the inventor which is defined by the appended claims.

What is claimed is:

1. A switched-mode power amplifier configured for integrally amplifying and summing a plurality of signals input thereto, said amplifier comprising an input component for each of said plurality of input signals, an output resonator component and a transformer component there between comprising a plurality of series-coupled input windings and an output winding, each said input component comprising one of said input windings and a plurality of active devices wherein said active devices are configured to be alternately switched by said input signal to present an amplified signal corresponding to said input signal at said input winding and a low impedance, wherein said output winding presents a summation signal corresponding to a summation of said amplified signals.

2. A switched-mode power amplifier according to claim 1 wherein said signals are analog phase modulated signals.

3. A switched-mode power amplifier according to claim 2 wherein each said input component comprises two active devices and each said input winding is a center-tapped winding the center tap of which is connected to a voltage rail, each terminal end of said winding being fed by one said active device.

4. A switched-mode power amplifier according to claim 2 wherein each said input component comprises two coupled pairs of active devices arranged in bridge configuration with said input winding wherein each said pair is alternately switched, one active device of each said pair being connected to a voltage rail and the other active device of each said pair being connected to ground, said input winding coupling together each said pair of active devices.

5. A switched-mode power amplifier according to claim 3 wherein said output winding is connected at one terminal end thereof to ground and at the other terminal end thereof to said resonator component.

6. A switched-mode power amplifier according to claim 3 comprising two output resonator components, wherein said output winding is connected at each terminal end thereof to one said resonator component in a balanced manner.

7. A switched-mode power amplifier according to claim 5 wherein said amplifier is one of class D or class E.

8. A switched-mode power amplifier according to claim 6 wherein said amplifier is one of class D or class E.

9. A switched-mode power amplifier according to claim 4 wherein said output winding is connected at one terminal end thereof to ground and at the other terminal end thereof to said resonator component.

10. A switched-mode power amplifier according to claim 4 comprising two output resonator components, wherein said output winding is connected at each terminal end thereof to one said resonator component in a balanced manner.

11. A switched-mode power amplifier according to claim 9 wherein said amplifier is one of class D or class E.

12. A switched-mode power amplifier according to claim 10 wherein said amplifier is one of class D or class E.

13. A switched-mode power amplifier configured for integrally amplifying and summing a plurality of signals input thereto, said amplifier comprising an input component for each of said plurality of input signals, an output resonator component for connection to a load and a transformer component between said input and resonant components, said transformer component comprising a plurality of series-coupled input windings and an output winding, each said input component comprising one said input winding and a plurality of active devices, said active devices being configured for alternate switching by said input signal for said input component, whereby said series-coupled input component windings constitute a series connection of low output impedance sources applied to said resonator component and said load.

14. A method for amplifying and summing a plurality of input signals to produce a single amplified, summation signal for input to a resonator component, said method comprising:

(a) amplifying each said input signal by a separate amplifier input component having a low output impedance to produce an amplified signal corresponding to said input signal within a winding of said input component, said amplifying comprising applying said input signal to active devices of said input component to cause alternate switching of said active devices; and, (b) coupling said windings of said input components in series to provide an effective input winding for a transformer component, whereby said summation signal is presented within an output winding of said transformer configured for output to said resonator component.

15. A method according to claim 14 whereby each said input signal is applied to two said active devices and each said input winding is a center-tapped winding the center tap of which is connected to a voltage rail, each terminal end of said winding being fed by one said active device.

16. A method according to claim 14 whereby each said input signal is applied to each active device of two coupled pairs of active devices arranged in bridge configuration with said input winding wherein each said pair is alternately switched, one active device of each said pair being connected to a voltage rail and the other active device of each said pair being connected to ground, said input winding coupling together each said pair of active devices.

* * * * *